(12) United States Patent
Bängs et al.

(10) Patent No.: US 6,504,403 B2
(45) Date of Patent: Jan. 7, 2003

(54) LOW VOLTAGE DIFFERENTIAL SIGNAL (LVDS) INPUT CIRCUIT

(75) Inventors: Joakim Bängs, Swindon (GB); John Thompson, Macclesfield (GB); Raymond Filippi, Swindon (GB)

(73) Assignee: Telefonaktiebolaget LM Ericsson, Stockholm (SE)

( * ) Notice: Subject to any disclaimer, the term of this patent is extended or adjusted under 35 U.S.C. 154(b) by 0 days.

(21) Appl. No.: 09/739,263

(22) Filed: Dec. 19, 2000

(65) Prior Publication Data

US 2001/0004219 A1 Jun. 21, 2001

(30) Foreign Application Priority Data

Dec. 20, 1999 (GB) .............................................. 9930051

(51) Int. Cl.⁷ ............................................... H03K 5/153
(52) U.S. Cl. .......................... 327/62; 330/254; 330/258; 327/63; 327/68; 327/65
(58) Field of Search ................................ 330/258, 254, 330/252, 253, 259; 327/62, 65, 63, 68, 70

(56) References Cited

U.S. PATENT DOCUMENTS

| 4,446,385 A | | 5/1984 | Orengo et al. ................. 327/63 |
|---|---|---|---|
| 4,555,673 A | | 11/1985 | Huijsing et al. ............ 330/258 |
| 4,814,643 A | | 3/1989 | Ishihara ........................ 327/64 |
| 5,414,388 A | | 5/1995 | Sauer .......................... 330/252 |
| 5,418,453 A | * | 5/1995 | Wise ........................... 324/160 |
| 5,583,425 A | | 12/1996 | Rapp et al. .................. 323/316 |
| 5,614,852 A | | 3/1997 | Giordano et al. ............. 327/63 |
| 5,789,949 A | | 8/1998 | Giordano et al. ............. 327/63 |
| 5,864,587 A | * | 1/1999 | Hunt ............................ 375/316 |
| 5,889,419 A | | 3/1999 | Fischer et al. ................. 327/70 |
| 6,288,577 B1 | * | 9/2001 | Wong ........................... 327/65 |

FOREIGN PATENT DOCUMENTS

| EP | 0134925 | 3/1985 |
|---|---|---|
| GB | 2297211 | 7/1996 |
| WO | WO97/17763 A | 5/1997 |
| WO | WO98/00911 A | 1/1998 |
| WO | WO99/11038 A | 3/1999 |

OTHER PUBLICATIONS

IEEE Std 1596.3–1996 —Description: IEEE Standard for Low–Voltage Differential Signals (LVDS) for Scalable Coherent Interface (SCI).

* cited by examiner

Primary Examiner—Tuan T. Lam
Assistant Examiner—Hiep Nguyen
(74) Attorney, Agent, or Firm—Burns, Doane Swecker & Mathis LLP

(57) ABSTRACT

Problems associated with using bipolar differential circuits over a wide common mode voltage range are solved using first and second amplifier circuits 3 and 5, respectively operating over first and second voltage sub-ranges. The low voltage differential signal (LVDS) 1 is applied across a pair of series connected resistors 7 and 9, and to the inputs of the amplifiers 3 and 5. The common mode voltage signal 11 is fed to the inputs of third and fourth amplifiers 15 and 17. The third and fourth amplifiers 15 and 17 ensure that the LVDS receiver has a constant linear transfer characteristic over the differential input signal range and over the full common mode range, especially over the amplifier transition region.

21 Claims, 6 Drawing Sheets

LOW VOLTAGE DIFFERENTIAL SIGNAL (LVDS) INPUT CIRCUIT

This application claims priority under 35 U.S.C. §§119 and/or 365 to 9930051.9 filed in Great Britain on Dec. 20, 1999; the entire content of which is hereby incorporated by reference.

FIELD OF INVENTION

The invention relates to a method and circuit for receiving low voltage differential signals (LVDS).

BACKGROUND OF THE INVENTION

Differential amplifiers are widely used to pick out small data signal voltages from larger noise voltages. This is accomplished by arranging the larger undesired signal to be the common-mode input voltage of a differential amplifier, and arranging the smaller data signal to be the differential input voltage. In this way, a differential amplifier can output an amplified version of the differential input voltage, that is the desired data signal, while cancelling any noise which has been introduced onto the differential signal during transmission. Low voltage-differential signals are used in many applications, for example telecommunications, where the data signal is susceptible to noise during transmission.

According to IEEE standard 1569.3-1996 for low voltage differential signals, differential transmission equipment should transmit signals with differential voltages of ±250 mV to ±400 mV and common mode voltages of 1.2V. Due to the fact that a receiver may have a different ground potential from an associated transmitter, the reception equipment has to be capable of receiving these signals with an extended common mode voltage range of between 0V to 2.4V to allow for possible deviation in the common mode voltage.

However, conventional differential circuits have difficulty in detecting differential signals over such a wide common mode voltage range, particularly when the supply voltage of the receiver is limited to 3V minimum, since the 2.4V range approaches the 3V supply voltage.

In addition, conventional differential circuits can only derive the differential signal from an input differential signal with a common mode voltage of about 1.2V or above. Conventional high speed differential circuits have difficulty deriving differential signals having a common mode voltage below this value, since the transistors of the detection circuitry fail to operate properly, (ie. they do not have enough voltage to turn them ON), and the current sources saturate.

Furthermore, complementary amplifiers used in conventional differential circuits normally use integrated PNP transistors in situations where the input common mode voltage is low. However, such transistors cannot be used in high frequency applications, because their cut-off frequency $f_t$ is usually less than the bandwidth of the application. Consequently, applications in the telecommunications field, when implemented in bipolar or bicmos technology, tend to use NPN transistors because their bandwidths are typically of the order of 100 times higher than bandwidths of PNP transistors.

Thus, for the reasons mentioned above, conventional differential circuits are not suitable for receiving low voltage differential signals, particularly in high frequency applications.

GB 2297211 discloses a differential signal receiver circuit which increases the common mode voltage range using a second differential amplifier fed through a level shifter, with the output current of first and second differential amplifiers summed to provide complementary signals. This circuit uses p-channel devices in the signal path (or pnp if implemented in bipolar technology), thus having the bandwidth disadvantages mentioned earlier.

U.S. Pat. No. 5,889,419 discloses another circuit having an improved common mode range. A first comparator is activated when the input voltages are above a first level, while a second comparator is activated when the input voltages are below a second level. However, the activation of the first and second comparators is provided by voltage level-sensing circuitry having hysteresis, which produces discontinuities in the output signal at the region where the circuit switches over from one comparator to another.

The aim of the present invention is to provide a low voltage differential signal receiver which operates over a wide common mode voltage range, and which has a linear transfer characteristic, even over the amplifier transition region.

SUMMARY OF THE INVENTION

According to a first aspect of the invention, there is provided a circuit for receiving a low voltage differential signal having a common mode voltage range, the circuit comprising:

a first amplifier circuit which operates in a first voltage sub-range of the common mode voltage range:

a second amplifier circuit which operates in a second voltage sub-range of the common mode voltage range, and, a control circuit for controlling the operation of the first and second amplifier circuits so as to provide an output signal over the common mode voltage range of the input signal, wherein the control circuit sums the output of the first and second amplifiers in an overlapping region of the first and second voltage sub-ranges.

According to a second aspect of the invention, there is provided a method of receiving a low voltage differential signal having a common mode voltage range, the method comprising the steps of:

providing a first amplifier circuit for operating in a first voltage sub-range of the common mode voltage range:

providing a second amplifier circuit for operating in a second voltage sub-range of the common mode voltage range, and, controlling the operation of the first and second amplifier circuits so as to provide an output signal over the common mode voltage range of the input signal, wherein the output signals from the first and second amplifiers are summed in an overlapping region of the first and second voltage sub-ranges.

BRIEF DESCRIPTION OF THE DRAWINGS

For a better understanding of the present invention, and to show more clearly how it may be carried into effect, reference will now be made, by way of example, to the accompanying drawings, in which.

DETAILED DESCRIPTION OF A PREFERRED EMBODIMENT OF THE PRESENT INVENTION

Figure 1:
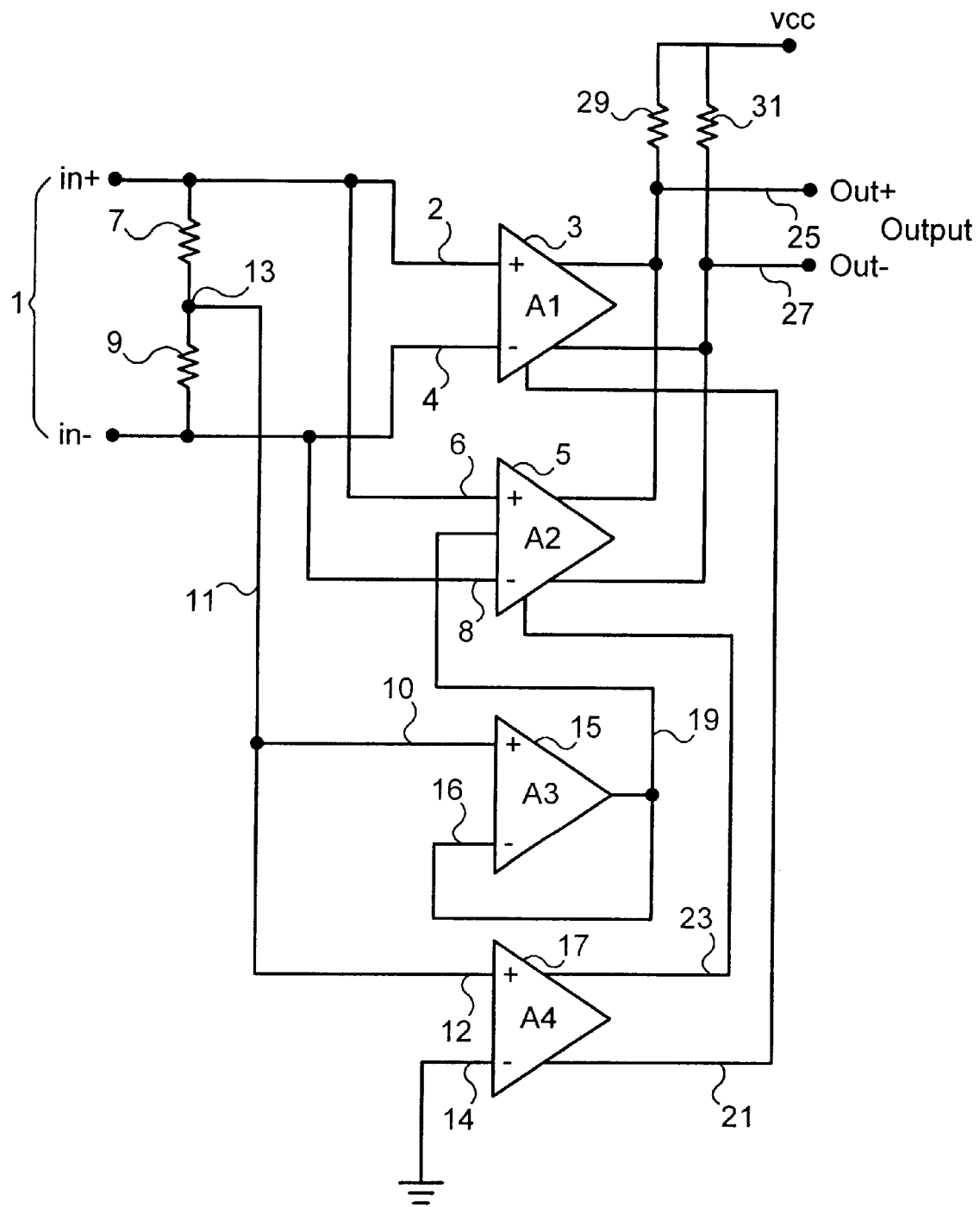
FIG. 1 shows a block schematic of a LVDS receiver according to a preferred embodiment of the present invention.

Referring to FIG. 1, a low voltage differential signal (LVDS) 1 is applied to first and second amplifiers 3 and 5, each amplifier having a pair of input terminals 2, 4 and 6, 8 respectively. A pair of series connected resistors 7 and 9 are connected across the input signal. The two resistors 7 and 9 have equal values, and provide a means of obtaining the common mode voltage signal 11 from the mid-point 13, whilst rejecting the differential input signal. The common mode voltage signal 11 is fed to respective first input terminals 10, 12 of third and fourth amplifiers 15 and 17.

The first amplifier 3 is a common emitter differential input stage which handles input signals with common mode voltages in the range from approximately 1.2V to 2.4V.

The second amplifier 5 is a common base differential input stage which handles input signals with common mode voltages in the range from 0v to approximately 1.2V. The bias for the second amplifier 5 is provided by the third amplifier 15, which is a high gain feedback amplifier.

The third amplifier 15 adds a base-emitter voltage $V_{BE}$ to the common mode voltage 11 received at its input terminal 10, and outputs this voltage level as a bias voltage 19 to the second amplifier 5.

The fourth amplifier 17 also receives the common mode voltage 11 at its first input terminal 12, and has its second input 14 connected to ground or reference. The fourth amplifier 17 generates two current outputs 21, 23 which control the operation of the first and second amplifiers 3 and 5 respectively. Each of the first and second amplifiers 3, 5 has two output terminals connected to the circuit output lines 25 and 27 respectively. Each output line 25, 27 is connected to the supply rail Vcc via a respective resistors 29, 31.

The first and second amplifiers 3 and 5 are controlled so that each amplifier operates over its allocated range of common mode voltage, and produces an output signal current across output lines 25, 27 which is proportional to the LVDS input signal current.

Thus, the first amplifier 3 is controlled so that it is operational in the voltage range from 1.2V to 2.4V, while the second amplifier 5 is controlled so that it is operational in the voltage range 0V to 1.2V.

An exception is during the crossover or transitional region where one amplifier will be turning OFF while the other is turning ON. During this transitional region, the fourth amplifier 17 controls the outputs of the first and second amplifiers 3 and 5 such that the sum of the two output currents is proportional to the LVDS input signal voltage. In this manner, the sum of the currents in the two amplifiers is constant, and the common mode voltage determines which amplifier is ON, which amplifier is OFF, and which is in an intermediate state, thereby providing a smooth, linear, transition between the operating regions.

Figure 2:
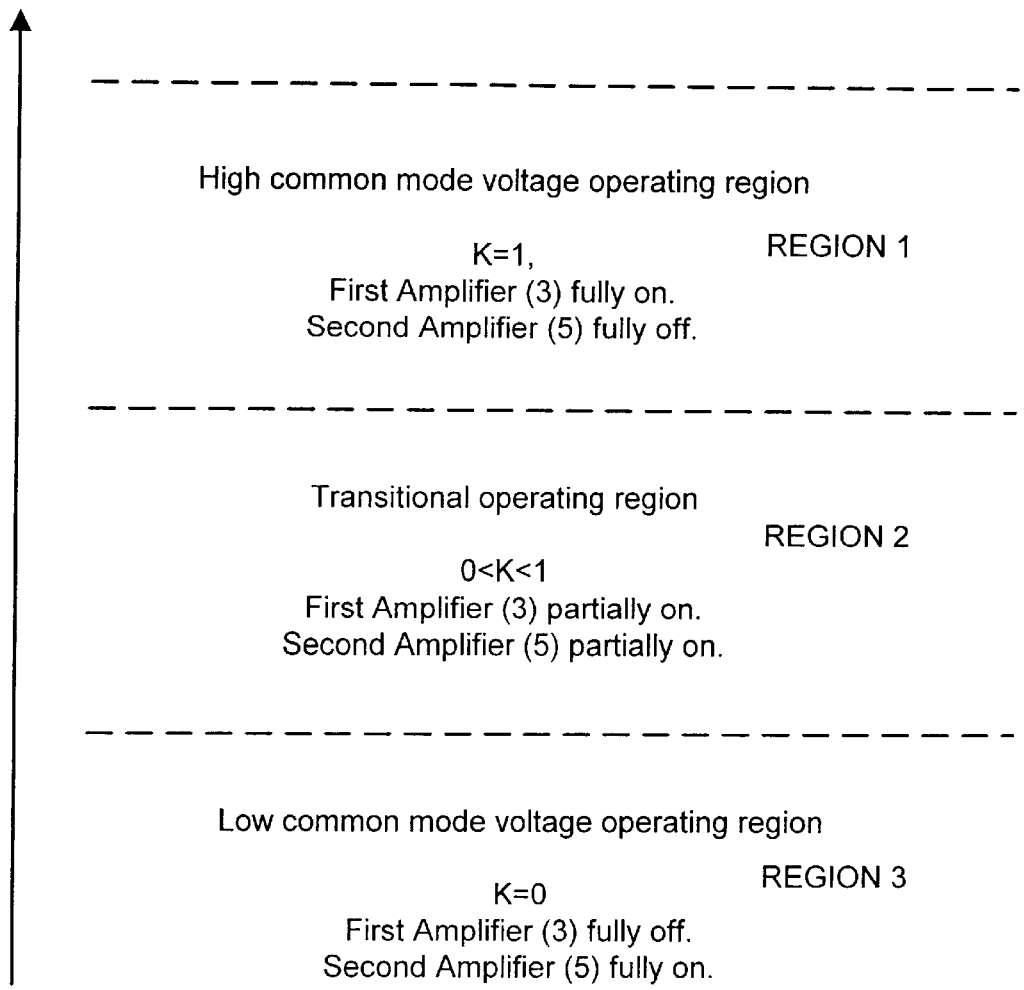
FIG. 2 shows the operating regions of the LVDS receiver of the present invention.

FIG. 2 shows the operating regions of the LVDS receiver of the present invention. K is a factor representing the degree to which the first and second amplifiers 3, 5, each contribute to the output signal. When the common mode voltage is high, as shown in the first region, K is equal to 1, and the first amplifier 3 will be fully turned ON, while the second amplifier 5 will be fully turned OFF.

In the second region, or the transitional region, K is greater than 0 and less than 1, and both the first amplifier 3 and second amplifier 5 will be partially turned ON.

In the third operating region, the common mode voltage is low, K is equal to 0, and the first amplifier 3 will be fully turned OFF, whereas the second amplifier 5 will be fully turned ON.

Thus, according to the invention described above, the low voltage differential signal receiving circuitry tracks the input signal over an extended common mode input voltage range using two input amplifiers, the first amplifier tracking the voltage signals over a first sub-range and the second amplifier tracking the signal over a second sub-range, and removes the common mode voltage variation and converts the current signal to a differential voltage waveform.

The operation of the two input amplifiers is controlled by the level of the common mode input voltage, and their outputs are combined in such a way as to produce an analogue output proportional to the input signal, the output being independent of the common mode input voltage over the full range, for example 0 volts to 2.4 volts. In addition, the circuit provides a soft transition from one amplifier to the other, and thus avoids any discontinuities at changeover.

Figure 3:
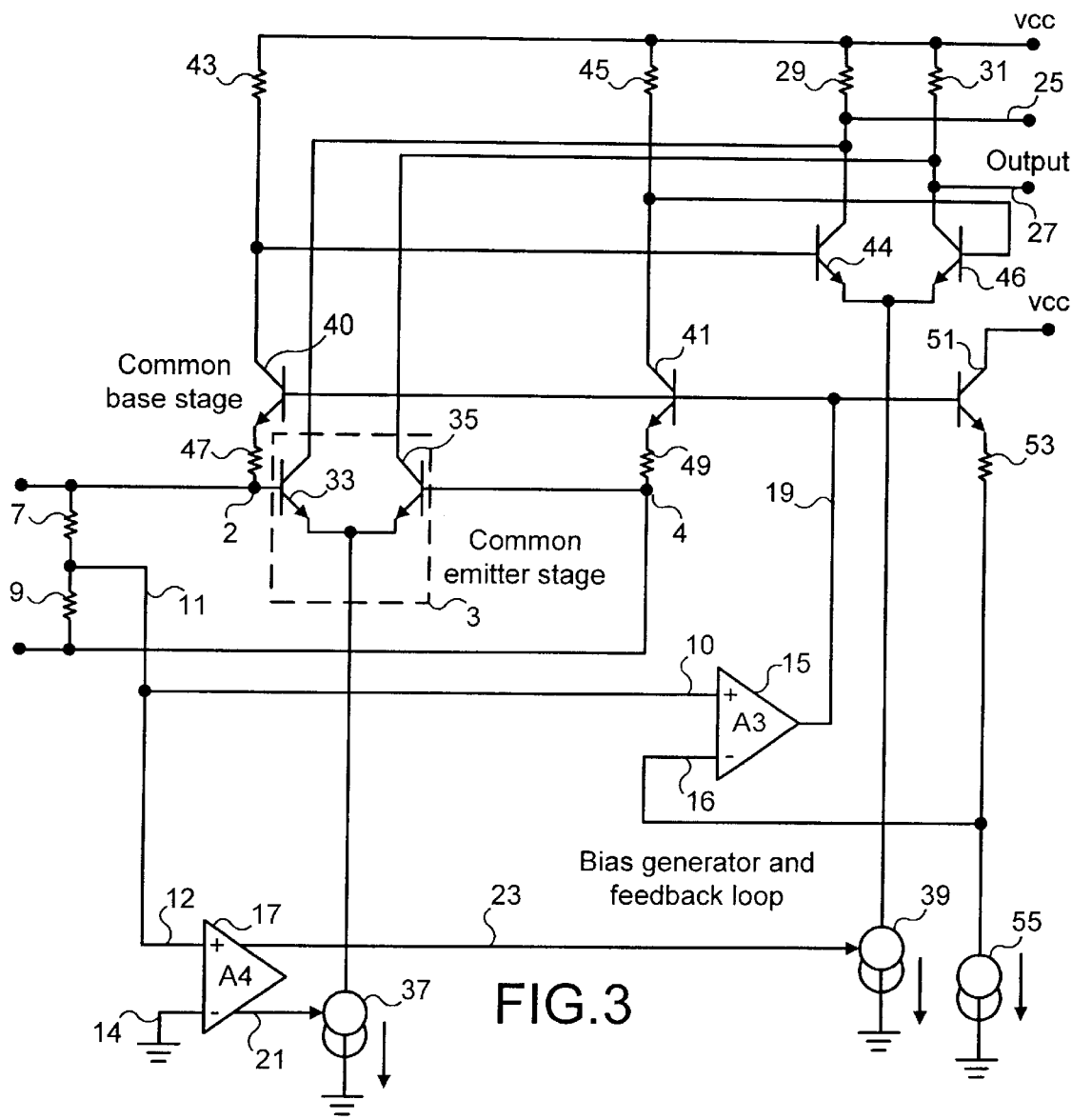
FIG. 3 shows a schematic diagram of a preferred implementation of the block schematic of FIG. 1.

FIG. 3 shows a preferred circuit for realising the block schematic of FIG. 1. One terminal of the input signal is connected to the base of a first transistor 33, while the other terminal of the input signal is connected to the base of a second transistor 35. The collectors of the respective transistors 33, 35 are connected to the output lines 25, 27, which are tied to the supply rail Vcc via resistors 29, 31. The emitters of each transistor 33, 35 are connected together to form the common emitter configuration, and connected to ground via a first current source 37. The first current source 37 is controlled by a first output 21 of the fourth amplifier 17.

Thus, transistors 33 and 35 form the differential common emitter input stage which operates from 1.2V to 2.4V common mode range, (i.e. the first amplifier 3 in FIG. 1).

The common base stage (i.e. the second amplifier 5 in FIG. 1) comprises third and fourth transistors 40, 41 having their bases connected together. The collectors of the third and fourth transistors 40, 41 are connected to the supply rail Vcc via respective resistors 43, 45. The emitter of the third transistor 40 is connected via a resistor 47 to the base of the first transistor 33, which as stated earlier, is also connected to a first terminal of the input signal. The emitter of the fourth transistor 41 is connected via a resistor 49 to the base of the second transistor 35, which is connected to the other terminal of the input signal.

The collectors of the third and fourth transistors 40, 41 are connected to the bases of a common emitter pair comprising transistors 44 and 46, the collectors of which are connected to the output lines 25 and 27 respectively. The common emitters of transistors 44 and 46 are connected to ground via a second current source 39, which is controlled from a second output 23 of the fourth amplifier 17.

The bias 19 for the common base stage is provided by the output of the third amplifier 15, which as explained in relation to FIG. 1, receives the common mode voltage 11 at one of its input terminals. The output of the third amplifier 15 is fed back to its input via the base-emitter path of a transistor 51, and series resistor 53. The collector of transistor 51 is connected to the supply rail Vcc. This input terminal of the third amplifier is also connected to ground via a third current source. The third amplifier 15 therefore has a high gain feedback loop.

Transistors 40 and 41, together with transistors 44 and 46 and resistors 43 and 45 form the common base input stage which operates from 0V to 1.2V common mode range, (corresponding to amplifier 5 in FIG. 1).

The output currents of the two stages described above are combined in the output resistors 29 and 31. The controlled current sources 37 and 39 are driven differentially, that is one is ON while the other is OFF, except over the small transition range where one is turning ON when the other is turning OFF. The sum of the currents from the two current sources is controlled to be constant, thereby in particular maintaining the output signal during the transition phase.

The current sources are controlled in this manner using the level of the common mode input voltage 11. The current source drive circuit, ie. amplifier 17, matches the common emitter stage such that the voltages and temperature coefficients track each other. The drive circuit is fed from the common mode input so that the common emitter stage is turned off as it runs out of headroom.

Preferably the combined outputs are suitable for driving a differential threshold circuit, such that the input to the LVDS circuit has a constant threshold level independent of common mode level.

Figure 4:
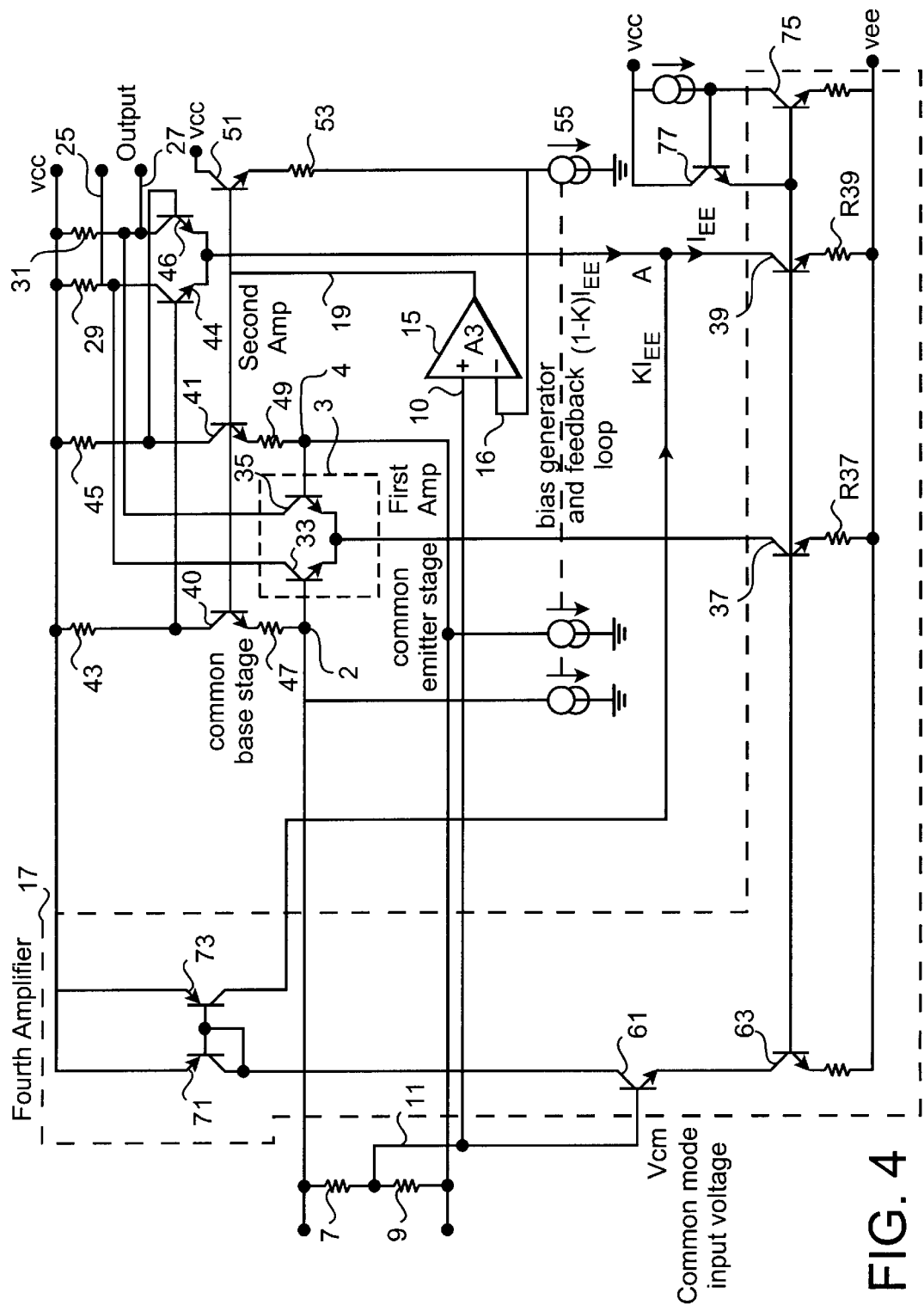
FIG. 4 shows a more detailed circuit diagram of the preferred LVDS receiver of the present invention, and in particular, the preferred circuit for realising the fourth amplifier of FIGS. 1 and 3.

FIG. 4 shows a preferred circuit for realising the LVDS receiver of FIGS. 1 and 3, and in particular, the preferred circuit for realising the fourth amplifier 17, (as shown in dotted lines).

The common base, or second amplifier 5, (comprising circuit elements 40, 41, 43, 44, 45, 46, 47 and 49), operates between 0–1.2v. The bias 19 for the second amplifier 5 is provided by the output of the third amplifier 15. The third amplifier 15 receives the common mode voltage 11 at its input 10. The output signal 19 is fed back to the second input terminal 16 of the third amplifier 15 via the base-emitter path of transistor 51 and series resistor 53. The collector of transistor 51 is connected to Vcc, thus providing a high gain feedback loop.

The bias signal 19 from the third amplifier 15 moves in synchronism with the common mode voltage. In this way, the third amplifier 15 provides a common mode follower that provides a bias signal for the common base amplifier 5.

The fourth amplifier 17 provides the tail current control, and determines which of the first and second amplifiers 3, 5 is ON, OFF, or in an intermediate state. The common mode voltage is applied to a first input terminal 12 of the fourth amplifier, and provides the bias for transistor 61.

The fourth amplifier 17 provides a means of driving the first and second amplifiers 3, 5, such as to achieve operation over the three regions described in FIG. 2 above.

When the common mode voltage 11 is significantly above 1.2v, i.e. in the first region of FIG. 2, transistor 61 in turned ON, and the current passed by transistor 61 is mirrored by transistors 71 and 73 to a current summing node "A". Since the current in transistor 75 will be mirrored in transistors 37, 39 and 63, and provided none of these are saturated, (which is the case in the high common mode voltage operating region), then K equals 1, and transistor 39 will be satisfied by the current in the branch labelled $KI_{EE}$. As a result, the second amplifier 5 will be turned OFF because its tail current will be close to zero. In this region, the output signal is provided entirely by the first amplifier 3.

When the common mode voltage is significantly below 1.2v, i.e. in the third region of FIG. 2, transistor 63 will be pushed into saturation by transistor 61, and transistor 61 will pass virtually no current. Likewise, transistor 37 will be pushed into saturation by the common emitter transistors 33 and 35 of the first amplifier, that is, the common emitter amplifier 3. In this region of operation, the tail current for the first amplifier 3 will be close to zero, and the mirrored current from transistors 71 and 73 will also be close to zero, thus making the gain K equal to zero. Thus, the current in transistor 39 will supply the tail current for the second amplifier 5, while the third amplifier 15 will maintain the correct bias level for the common base stage of the second amplifier 5. In this region, the output signal is provided entirely by the second amplifier 5. A β helper transistor 77, provides sufficient drive such that the collector current of transistor 39 is unaffected by transistors 37 and 63 going into saturation.

It is noted that the third amplifier 15 may be realised using a pnp (or pmos) input amplifier so that it can operate close to ground. However, since the common mode signal itself will be a low frequency signal, the use of a pnp input amplifier in this part of the circuit does not give rise to any bandwidth problems, when used in high frequency applications.

Next, the operation of FIG. 4 in the transitional, or second, region will be explained. When the common mode voltage rises from a low value, transistor 61 starts to turn ON, and this current is mirrored by transistors 71 and 73, supplying some of the transistor 39 current, thereby starting to turn OFF the second amplifier 5.

Simultaneously, as transistor 61 starts to pass current, transistor 63 will no longer be saturated, and therefore, transistor 37 will also start to pass current. As transistor 37 starts to pass current, the common emitter stage of the first amplifier 3 will also start to turn ON. A balance is reached when K equals 0.5, at which point the tail currents to each of the first and second amplifiers 3, 5, will be equal. Since the first and second amplifiers 3, 5, share the same load resistors, when the tail currents are equal, the two amplifiers will have the same gain, each contributing to half of the output swing on the load.

As K becomes greater than 0.5, the second amplifier 5 becoming more turned OFF, while the first amplifier 3 becomes more turned ON. This continues until K equals 1, in which case the second amplifier 5 is fully turned OFF and the first amplifier 3 is fully turned ON. Of course, the reverse applies as the common mode voltage falls from the first region, through the transitional region, or second region, to the third region.

Thus, a smooth linear transition is achieved as the common mode voltage moves between the various operating regions.

Figure 5:
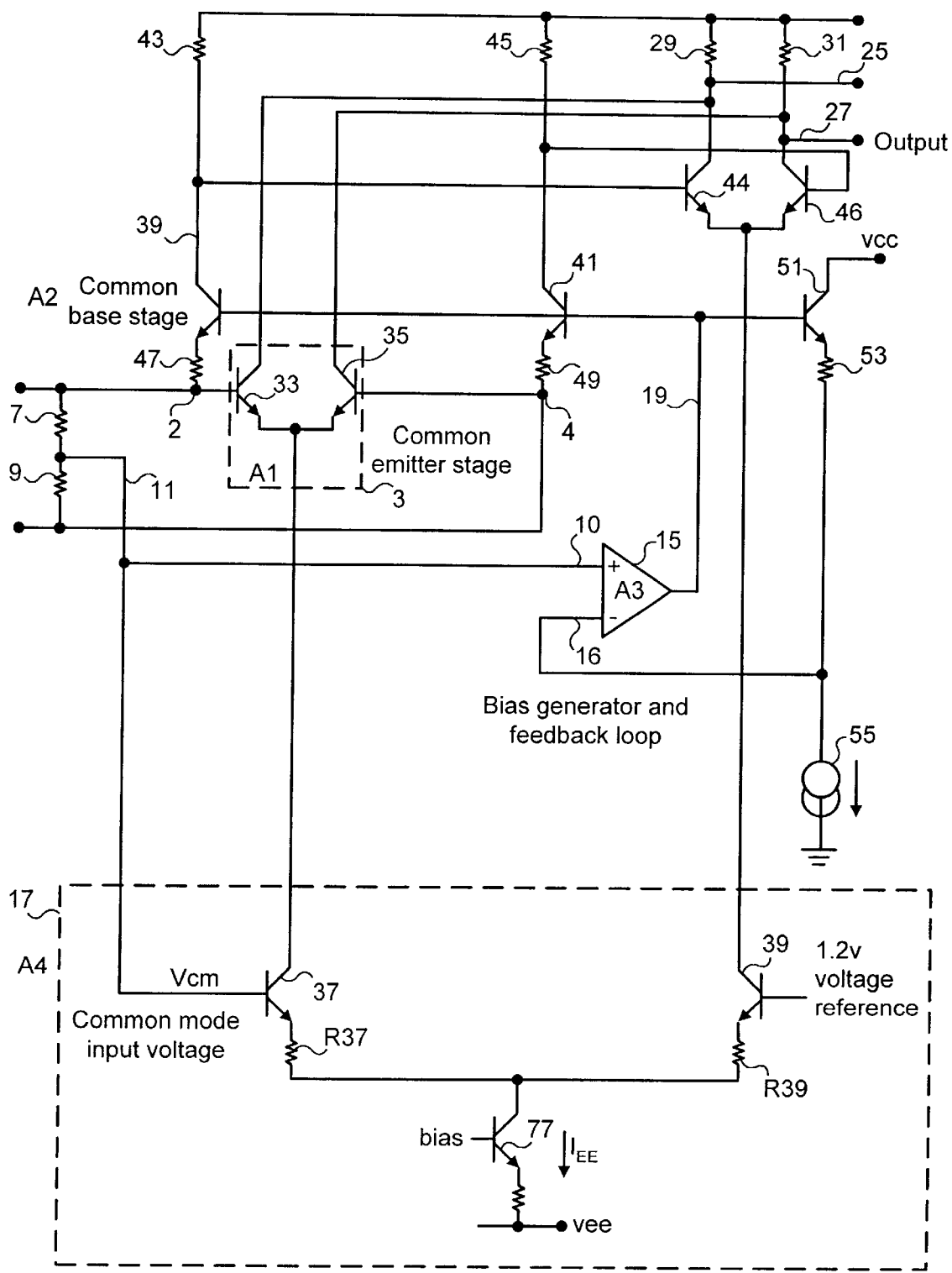
FIG. 5 shows a LVDS receiver of the present invention having an alternative circuit for realising the fourth amplifier of FIGS. 1 and 3; and, FIG. 6 shows a LVDS receiver of the present invention having another alternative circuit for realising the fourth amplifier of FIGS. 1 and 3.

FIG. 5 shows an alternative circuit for realising the fourth amplifier 17, in which the common emitters from the first and second amplifiers are connected to the collectors of transistors 37 and 39. Transistor 37 is biased by the common mode voltage 11, whereas transistor 39 is biased by a 1.2v voltage reference. The emitters of the transistors 37 and 39 are connected via respective resistors R37 and R39 to the collector of transistor 77. However, although this circuit is somewhat simpler than the preferred embodiment of FIG. 4, it suffers from the disadvantage of requiring more headroom, since the emitters of the first amplifier 3 have two transistors below them which require headroom, whereas-the preferred embodiment of FIG. 4 only requires headroom for one transistor.

Figure 6:
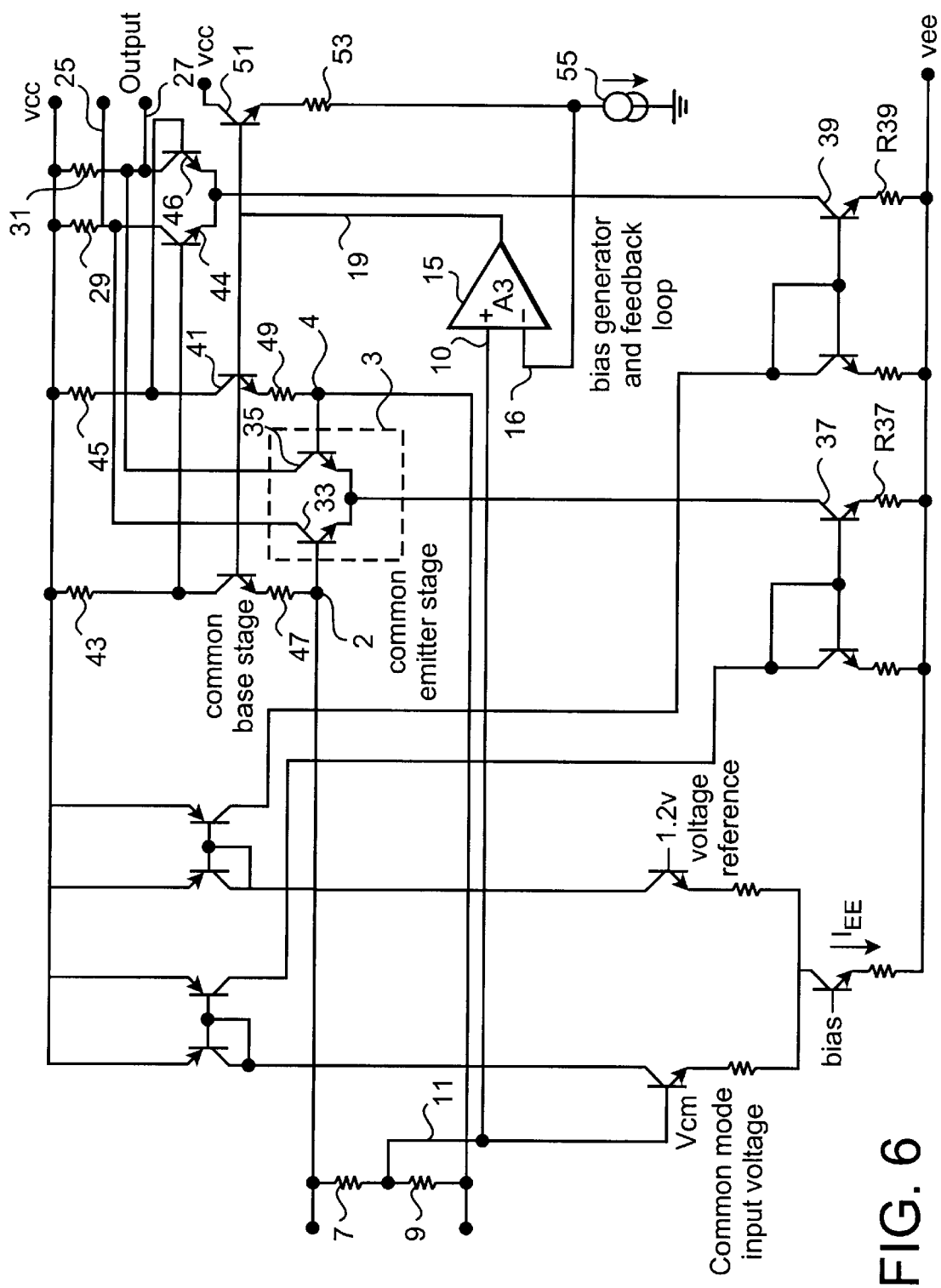

FIG. 6 shows yet another alternative circuit for realising the fourth amplifier 17. It solves the headroom problem mentioned above in FIG. 5, but requires a greater number of devices to implement, thus leading to more inaccuracies, which are avoided by using the preferred circuit of FIG. 4.

The invention described above solves the problems of using bipolar differential circuits over a wide common mode voltage range in the LVDS input environment by sensing the common mode voltage and using it to control the required functions with a supply voltage limited to 3 volts minimum.

Furthermore, the invention provides a LVDS receiver which has a constant linear transfer characteristic over the differential input signal range and over the full common mode range, especially over the amplifier transition region.

Although the description refers to the first amplifier circuit operating in a voltage range from 0 volts to 1.2 volts, the second stage working from 1.2 volts to 2.4 volts, and the supply voltage being 3 volts, it will be appreciated that these are only exemplary values, and the actual values may differ without departing from the scope of the invention as defined in the appended claims.

What is claimed is:

1. A circuit for receiving a low voltage differential input signal having a common mode voltage range, the circuit comprising:
   a first amplifier circuit which operates in a first voltage sub-range of the common mode voltage range;
   a second amplifier circuit which operates in a second voltage sub-range of the common mode voltage range; and
   a control circuit for controlling the operation of the first and second amplifier circuits so as to provide an output signal over the common mode voltage range of the input signal, and for controlling the summation of the outputs of the first and second amplifiers in an overlapping region of the first and second voltage sub-ranges.

2. A circuit as claimed in claim 1, wherein the first amplifier is a common emitter amplifier circuit.

3. A circuit as claimed in claim 2, wherein the common emitter amplifier circuit is self biased by the input.

4. A circuit as claimed in claim 1, wherein the second amplifier circuit is a common-base amplifier circuit.

5. A circuit as claimed in claim 4, wherein the common base amplifier circuit is connected to receive the input signal, and biased using the common mode voltage of the input signal.

6. A circuit as claimed in claim 5, further comprising a third amplifier circuit for adding a base-emitter voltage to the common mode voltage, and outputting the combined voltage level as the bias voltage to the common-base amplifier circuit.

7. A circuit as claimed in claim 5, wherein the common mode voltage is derived from the mid point of two resistors connected in series across the input signal.

8. A circuit as claimed in claim 1, wherein the control circuit operates the first amplifier during a first voltage sub-range, operates the second amplifier during a second voltage sub-range, and operates both amplifiers in the overlapping region when both amplifiers are turned partially on.

9. A circuit as claimed in claim 8, wherein the control circuit receives the common mode voltage and outputs two current outputs for controlling the operation of the first and second amplifiers.

10. A circuit as claimed in claim 1, wherein the control circuit comprises:
    a first transistor (61) biased by the common mode voltage, having its collector connected to a current mirror circuit and its emitter connected to the collector of a second transistor (63);
    the current mirror circuit comprising a third transistor (71) having its collector connected to the collector of the first transistor (61), and its emitter connected to a supply voltage, the base of the third transistor (71) being fed back to its collector and connected to the base of a fourth transistor (73) having its emitter connected to a common emitter pair of the second amplifier (5);
    the second transistor (63) having its emitter connected to ground via a resistor, and its base connected in common with the bases of fifth and sixth transistors (37, 39); wherein
    the fifth transistor (37) has its collector connected to an emitter pair of the first amplifier (3), and its emitter connected to ground via a resistor; wherein
    the sixth transistor (39) has its collector connected to an emitter pair in the second amplifier (5), and its emitter connected to ground via a resistor.

11. A circuit as claimed in claim 1, wherein the outputs of the amplifiers are capable of driving a differential threshold circuit.

12. A circuit as claimed in claim 1, wherein the circuit is capable of being used in a high speed bipolar integrated circuit process.

13. A method of receiving a low voltage differential input signal having a common mode voltage range, the method comprising the steps of:
    providing a first amplifier circuit for operating in a first voltage sub-range of the common mode voltage range;
    providing a second amplifier circuit for operating in a second voltage sub-range of the common mode voltage range; and
    controlling the operation of the first and second amplifier circuits so as to provide an output signal over the common mode voltage range of the input signal, wherein the output signals from the first and second amplifiers are summed in an overlapping region of the first and second voltage sub-ranges.

14. A method as claimed in claim 13, wherein the first amplifier circuit is a common emitter amplifier circuit.

15. A method as claimed in claim 14, comprising biasing the common emitter amplifier circuit by the input.

16. A method as claimed in any one of claims 13, wherein the second amplifier circuit is a common-base amplifier circuit.

17. A method as claimed in claim 16, further comprising the step of connecting the common-base amplifier circuit to receive the input signal, and biasing it using the common mode voltage of the input signal.

18. A method as claimed in claim 17, wherein a base-emitter voltage is added by a third amplifier circuit to the common mode voltage, and the combined voltage level used to bias the common-base amplifier circuit.

19. A method as claimed in claim 17, wherein the common mode voltage is derived from the mid point of two resistors connected in series across the input signal.

20. A method as claimed in any one of claim 13, wherein the controlling step comprises:

operating the first amplifier during a first voltage sub-range;

operating the second amplifier during a second voltage sub-range; and, operating both amplifiers in the overlapping region when both amplifiers are turned on.

21. A method as claimed in claim 20, wherein a fourth amplifier circuit is provided for receiving the common mode voltage and outputting two current outputs for controlling the operation of the first and second amplifiers.

* * * * *